(12) United States Patent
Zhu et al.

(10) Patent No.: US 12,101,982 B2
(45) Date of Patent: Sep. 24, 2024

(54) PIXEL STRUCTURE, DRIVING METHOD THEREOF, DISPLAY PANEL, AND DISPLAY APPARATUS

(71) Applicant: BOE Technology Group Co., Ltd., Beijing (CN)

(72) Inventors: Zhijian Zhu, Beijing (CN); Pengcheng Lu, Beijing (CN); Chenyu Chen, Beijing (CN); Shengji Yang, Beijing (CN); Xiaochuan Chen, Beijing (CN); Yan Sun, Beijing (CN); Tiankuo Shi, Beijing (CN); Xiaomang Zhang, Beijing (CN); Yuanlan Tian, Beijing (CN); Dacheng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 409 days.

(21) Appl. No.: 17/636,030

(22) PCT Filed: Apr. 27, 2021

(86) PCT No.: PCT/CN2021/090111
§ 371 (c)(1),
(2) Date: Feb. 17, 2022

(87) PCT Pub. No.: WO2022/226754
PCT Pub. Date: Nov. 3, 2022

(65) Prior Publication Data
US 2023/0345787 A1 Oct. 26, 2023

(51) Int. Cl.
*H01L 29/08* (2006.01)
*H10K 59/131* (2023.01)
*H10K 59/35* (2023.01)

(52) U.S. Cl.
CPC ......... *H10K 59/353* (2023.02); *H10K 59/131* (2023.02); *H10K 59/351* (2023.02)

(58) Field of Classification Search
CPC .. H10K 59/353; H10K 59/131; H10K 59/351; H10K 59/35; H10K 59/352;
(Continued)

(56) References Cited

U.S. PATENT DOCUMENTS

2005/0225574 A1 10/2005 Brown Elliott et al.
2009/0121983 A1* 5/2009 Sung .................... H10K 59/352
345/76
(Continued)

FOREIGN PATENT DOCUMENTS

CN 1722193 A 1/2006
CN 106023819 A 10/2016
(Continued)

*Primary Examiner* — Niki H Nguyen
(74) *Attorney, Agent, or Firm* — Ling Wu; Stephen Yang; Ling and Yang Intellectual Property

(57) ABSTRACT

A pixel structure, a driving method thereof, a display panel, and a display apparatus are provided. The pixel structure includes: a plurality of pixel rows and a plurality of pixel columns. Each pixel row includes: sub-pixels of four different colors. The plurality of pixel columns include: a plurality of first pixel columns and a plurality of second pixel columns arranged alternately. Each of the first pixel columns includes: sub-pixels of three of the four different colors. Each of the second pixel columns includes: sub-pixels of another color other than the three of the four different colors.

20 Claims, 8 Drawing Sheets

(58) Field of Classification Search
CPC ........ H10K 59/12; H10K 50/00; H10K 59/10; H10K 50/13; H10K 2102/302; H01L 25/167; H01L 27/14645; H01L 27/14609
See application file for complete search history.

(56) References Cited

U.S. PATENT DOCUMENTS

| | | | |
|---|---|---|---|
| 2011/0291549 A1* | 12/2011 | Kim | H10K 59/353 |
| | | | 313/504 |
| 2014/0313112 A1 | 10/2014 | Madhusudan | |
| 2018/0226021 A1 | 8/2018 | Jin | |
| 2018/0286299 A1* | 10/2018 | Yang | H10K 59/351 |
| 2019/0073938 A1* | 3/2019 | Shi | G09G 3/3275 |
| 2020/0051485 A1 | 2/2020 | Liu et al. | |
| 2021/0335906 A1 | 10/2021 | Liu et al. | |
| 2022/0130882 A1 | 4/2022 | Tang et al. | |

FOREIGN PATENT DOCUMENTS

| | | |
|---|---|---|
| CN | 106206657 A | 12/2016 |
| CN | 106991957 A | 7/2017 |
| CN | 108717839 A | 10/2018 |
| CN | 108873439 A | 11/2018 |
| CN | 109427265 A | 3/2019 |
| CN | 110649057 A | 1/2020 |
| EP | 1679907 A1 | 7/2006 |

\* cited by examiner

PIXEL STRUCTURE, DRIVING METHOD THEREOF, DISPLAY PANEL, AND DISPLAY APPARATUS

CROSS-REFERENCE TO RELATED APPLICATION

The present application is a U.S. National Phase Entry of International Application No. PCT/CN2021/090111 having an international filing date of Apr. 27, 2021. The above-identified application is hereby incorporated by reference.

TECHNICAL FIELD

Embodiments of the disclosure relate to, but not limited to, the field of display technology, and in particular, to a pixel structure, a driving method thereof, a display panel, and a display apparatus.

BACKGROUND

An Organic Light-Emitting Diode (OLED) display device has the advantages of thin thickness, light weight, wide viewing angle, active luminescence, continuous and adjustable luminous color, low cost, fast response, low driving voltage, wide working temperature range, simple production process, flexible display, and the like, and is more and more widely used in display fields such as mobile phones, tablet computers, digital cameras. However, some OLED display devices have the problem of low luminous brightness.

SUMMARY

The following is a brief introduction for a subject described herein in detail. The present brief introduction is not intended to limit the scope of protection of claims.

According to a first aspect, the embodiments of the disclosure provide a pixel structure, including: a plurality of pixel rows and a plurality of pixel columns. Each pixel row includes: sub-pixels of four different colors. The plurality of pixel columns include: a plurality of first pixel columns and a plurality of second pixel columns arranged alternately. Each of the first pixel columns includes: sub-pixels of three of the four different colors. Each of the second pixel columns includes: sub-pixels of another color other than the three of the four different colors.

According to a second aspect, the embodiments of the disclosure further provide a pixel structure, including: a plurality of pixels arranged in an array. Each pixel includes: sub-pixels of four different colors. In each pixel, the ratio of the quantities of the sub-pixels of four different colors is 1:1:1:3.

According to a third aspect, the embodiments of the disclosure further provide an display panel, including the pixel structure as described in the abovementioned embodiments.

According to a fourth aspect, the embodiments of the disclosure further provide a display apparatus, including the display panel as described in the abovementioned embodiments.

According to a fifth aspect, the embodiments of the disclosure further provide a driving method for the pixel structure, which is applied to the pixel structure as described in the abovementioned embodiments. The driving method includes: acquiring an original signal corresponding to each pixel in each frame, herein, the original signal includes: original brightness values corresponding to sub-pixels of three of four different colors; converting the original signal corresponding to each pixel into a target signal corresponding to each pixel, herein, the target signal includes: target brightness values corresponding to the sub-pixels of the four different colors; and outputting the target signal corresponding to each pixel.

Other features and advantages of the disclosure will be illustrated in subsequent specification, and in addition, partially become apparent from the specification, or be understood by implementing the disclosure. Other advantages of the disclosure can be implemented and achieved by the solutions described in the specification and accompanying drawings.

After the accompanying drawings and detailed descriptions are read and understood, other aspects may be understood.

BRIEF DESCRIPTION OF DRAWINGS

The accompanying drawings are used for providing understanding of technical solutions of the present disclosure, constitute a part of the specification, and are used for explaining the technical solutions of the disclosure together with embodiments of the disclosure, but do not constitute a limitation to the technical solutions of the disclosure. The shape and size of the components in the accompanying drawings do not reflect true scale and are only intended to illustrate the contents of the disclosure.

DETAILED DESCRIPTION

Figure 1:
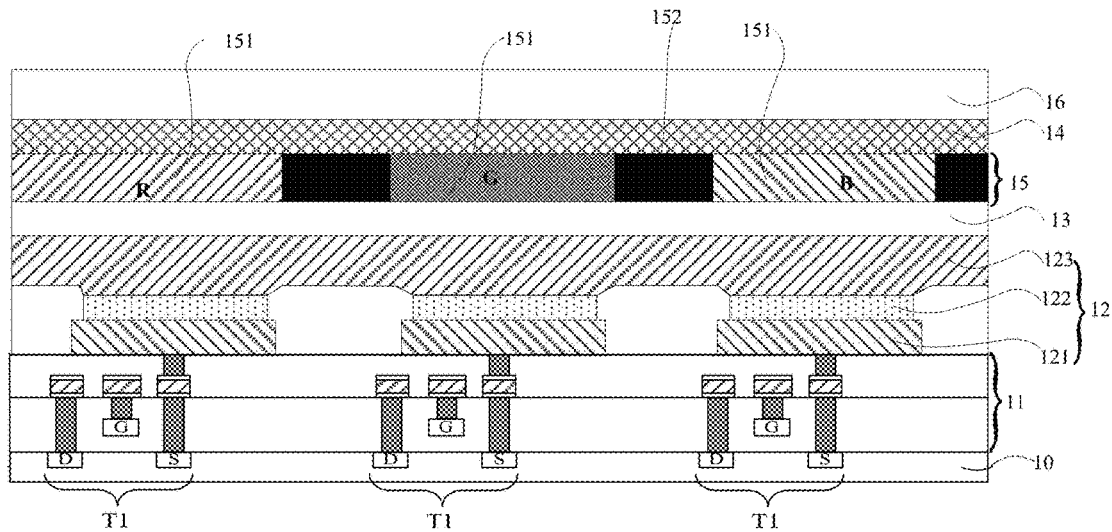
FIG. 1 illustrates a structural schematic diagram of an OLED display device.

A plurality of embodiments are described herein. However, the description is illustrative, but not restrictive. There may be more embodiments and implementation solutions within the scope included in the embodiments described herein. Although many possible feature combinations are shown in the accompanying drawings and are discussed in illustrative implementation manners, many other combinations of the disclosed features are also possible. Unless specifically restricted, any feature or element of any embodiment may be combined for use with any other feature or element in any other embodiments, or may replace any other feature or element in any other embodiments.

The specification may have presented a method or a process with a specific step sequence when representative embodiments are described. However, the method or process should not be limited to steps in a specific sequence insofar as that the method or process does not depend on the specific sequence of the steps described herein. Those of ordinary in the art will understand that other step sequence may also be possible. Therefore, the specific sequence of the steps illustrated in the specification should not be interpreted as a limitation of claims. In addition, the claims with respect to the method or process should not be limited to execute their steps according to the written sequence. Those skilled in the art may easily understand that these sequences may change, and are still maintained in the spirit and scope of the embodiments of the disclosure.

In the accompanying drawings, the size of a constituent element, and the thickness of a layer or an area are sometimes exaggerated for clarity. Therefore, one mode of the disclosure is not necessarily limited to the size, and the shape and size of the components in the accompanying drawings do not reflect the true scale. In addition, the accompanying drawings schematically show an ideal example, and one mode of the disclosure is not limited to the shape, value, or the like shown in the accompanying drawings.

Ordinal numerals such as "first", "second" and "third" in the specification are set to avoid confusion of constituent elements, but are not intended to limit in terms of quantity.

In the present specification, for convenience, words and sentences indicating orientations or positional relationships, such as "center", "upper", "lower", "front", "back", "vertical", "horizontal", "top", "bottom", "inside", "outside", and the like are used to describe the positional relationships of the constituent elements with reference to the accompanying drawings, and are merely for facilitating describing the present specification and simplifying the description, rather than indicating or implying that the referred apparatuses or elements must have particular orientations, and be constructed and operated in particular orientations. Thus, it cannot be construed as a limitation to the disclosure. The positional relationships of the constituent elements appropriately change according to the directions of describing the constituent elements. Therefore, it is not limited to the words and sentences described in the specification, and can be replaced appropriately according to the situation.

In the description, unless otherwise specified and defined explicitly, terms "mount", "mutually connect", "connect" and the like should be broadly understood. For example, the terms may refer to fixed connection, or detachable connection, or integration. The terms may refer to mechanical connection or electrical connection. The terms may refer to direct mutual connection, may refer to indirect connection through a medium, and may refer to communication in two components. For those of ordinary skill in the art, the meanings of the abovementioned terms in the disclosure can be understood according to the situation.

Herein, "electrical connection" includes the situation that the constituent elements are connected together by an element with a certain electrical effects. There is no specific restriction on "the element with a certain electrical effects" as long as it can transmit and receive electrical signals between connected constituent elements. For example, "the element with a certain electrical effects" may be an electrode or a wire, or a switch element, such as a transistor, or other functional elements, such as a resistor, an inductor, a capacitor, or the like.

Herein, the transistor refers to an element at least including three terminals of a gate electrode, a drain electrode, and a source electrode. The transistor has a channel area between the drain electrode (or called a drain electrode terminal or a drain area) and the source electrode (or called a source electrode terminal or a source area), and current can flow through the drain electrode, the channel area, and the source electrode. Herein, the channel area refers to an area where the current mainly flows. Herein, the functions of the "source electrode" and the "drain electrode" may sometimes be exchanged with each other in the situation that the transistors with opposite polarity are used or the current direction changes during circuit operation. Therefore, herein, the "source electrode" and the "drain electrode" may be exchanged with each other.

"About" and "approximately" used in the embodiments of the disclosure refer to the values within an allowable process and measurement error range without strictly limiting a limit.

"Side by side" used in the embodiments of the disclosure refers to being arranged on a line (row or column), regardless of front and rear.

FIG. 1 illustrates a structural schematic diagram of an OLED display device. As shown in FIG. 1, in the direction perpendicular to the OLED display device, the OLED display device may include: a base substrate 10, a pixel driving circuit 11 arranged on the base substrate 10, and a pixel structure, arranged on one side, far away from the base substrate 10, of the pixel driving circuit 11. For example, the pixel driving circuit 11 may include a plurality of pixel circuits, which are respectively arranged to drive a plurality of subsequently formed light-emitting elements 12 in a pixel structure. A circuit structure and layout of the pixel circuit may be designed according to an actual situation, which is not limited by the embodiments of the disclosure. For clarity and simplicity, FIG. 1 only schematically illustrates a transistor T1 in each pixel circuit in the pixel driving circuit 11. The transistor T1 is arranged to be coupled with the subsequently formed light-emitting element 12. For example, the pixel driving circuit 11 may further include a plurality of lines, such as a scanning signal line and a data signal line, which is not limited by the embodiments of the disclosure. For example, the base substrate 10 may be a silicon-based base substrate, such as a monocrystalline silicon base substrate, but is not limited thereto.

In an illustrative embodiment, as shown in FIG. 1, taking the transistor T1 as an example, the transistor T1 in the pixel driving circuit 11 may include a gate electrode G, a source electrode S, and a drain electrode D. For example, the three electrodes are electrically connected to three electrode connecting parts respectively, for example, through a tungsten filled via hole (i.e., a tungsten via, W-via). Then, the three electrodes may be electrically connected to other electrical structures (such as the transistor, the wire, and the light-emitting element) respectively through corresponding electrode connecting parts.

In an illustrative embodiment, as shown in FIG. 1, in the direction perpendicular to the OLED display device, the OLED display device may include: a plurality of light-emitting elements 12 formed on the pixel driving circuit 11. For example, the light-emitting element 12 may include a first electrode 121 (for example, as an anode), an organic light-emitting functional layer 122, and a second electrode 123 (for example, as a cathode) that are stacked in turn. For example, the first electrode 121 may be electrically connected to the source electrode S of the corresponding transistor T1 through the tungsten via (such as through a connecting part corresponding to the source electrode S). Herein, the positions of the source electrode S and the drain electrode D may be exchanged, i.e., the first electrode 121 may be connected to the drain electrode D instead. For example, the organic light-emitting functional layer 122 may include an Emitted-Light (EL) layer, and may further include one or more of an electron injection layer, an electron transport layer, a hole injection layer, and a hole transport layer. For example, the second electrode 123 may be a transparent electrode. For example, the second electrode 123 may be a common electrode, i.e., a plurality of light-emitting elements 12 in the pixel structure may share a whole surface of the second electrode 123.

In an illustrative embodiment, as shown in FIG. 1, in the direction perpendicular to the OLED display device, the OLED display device may further include: a first encapsulation layer 13, a color filtering layer 15, and a second encapsulation layer 14 that are arranged on the plurality of light-emitting elements 12 in turn. For example, the color filtering layer 15 may include: a plurality of Color Filters (CF) 151 and Black Matrics (BM) 152 located between adjacent color filters 151. The plurality of color filters 151 correspond to the plurality of light-emitting elements in the pixel structure, and are arranged to enable the light emitted from the light-emitting elements to transmit. One color filter 151 and the corresponding light-emitting element may form a sub-pixel. For example, the color filter 151 may include a Red (R) filter unit, a Green (G) filter unit, and a Blue (B) filter unit. The Red (R) filter unit, the Green (G) filter unit, and the Blue (B) filter unit may respectively correspond to a Red (R) sub-pixel, a Green (G) sub-pixel, and a Blue (B) sub-pixel. For example, the material of the color filter 151 may be color photoresist (or, also called color photoresist for short), but is not limited thereto. For example, the first encapsulation layer 13 and the second encapsulation layer 14 may be any one or more of polymer and ceramic Thin Film Encapsulation (TFE) layers, but is not limited thereto.

In an illustrative embodiment, the OLED display device may further include: a cover plate 16 arranged on one side, far away from the base substrate 10, of the second encapsulation layer 14. For example, the cover plate 16 may be a glass cover plate, but is not limited thereto.

In an illustrative embodiment, taking the first encapsulation layer 13 and the second encapsulation layer 14 being the TFE layers as an example, because an OLED material and a cathode (generally, Mg/Ag) material are sensitive to water (H2O) and oxygen (O2) (i.e., are easily oxidized), the TFE layer can protect the OLED display device. Thus, an effect of protecting the OLED display device may be achieved by isolating water and oxygen by using a thin film encapsulation technology.

In one aspect, as shown in FIG. 1, some OLED display devices (such as, Micro OLED display devices) usually implement color display by using a light-emitting layer emitting white light and the CF 151. Herein, the CF 151 implements the transmission of "monochromatic light" (for example, the transmission of monochromatic red light, monochromatic blue light, or monochromatic green light) by absorbing light with a specific wavelength, so the brightness will be greatly reduced after the white light emitted from the light-emitting layer of the white light in the OLED display device transmits through the CF 151. At present, the transmittance of a low-temperature CF 151 used in some OLED display devices (such as, the Micro OLED display devices) is about between 18% and 30%, and the Aperture Ratio (AR) of the anode in an Active Area (AA) is about between 60% and 70%. Then, it can be known by calculating according to the Formula (1) below that about ¼ of the white light emitted by the light-emitting layer in some OLED display devices (for example, the Micro OLED display devices) is effectively utilized at present. Therefore, low transmittance of the CF 151 is a significant constraint that results in lower luminous brightness and higher power consumption of some OLED display devices (for example, the Micro OLED display devices).

$$L_{CF}=\tau \times \alpha \times L \qquad \text{Formula (1);}$$

In Formula (1), τ represents the transmittance of the CF in the OLED display device, α represents the aperture ratio of the area AA in the OLED display device, L represents the brightness of white light emitted by the OLED display device, and $L_{CF}$ represents the brightness that can be felt by human eyes after the white light emitted by the OLED display device transmits through the CF.

Figure 2A:
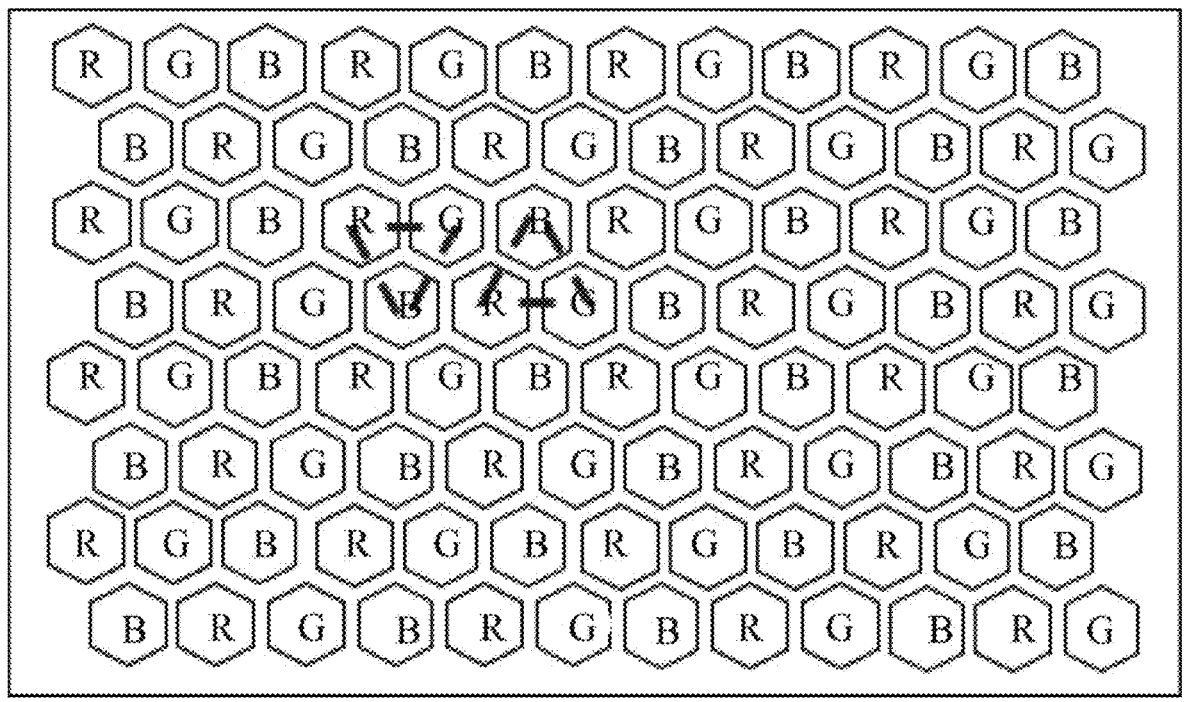
FIG. 2A illustrates a structural schematic diagram of a pixel structure.
Figure 2B:
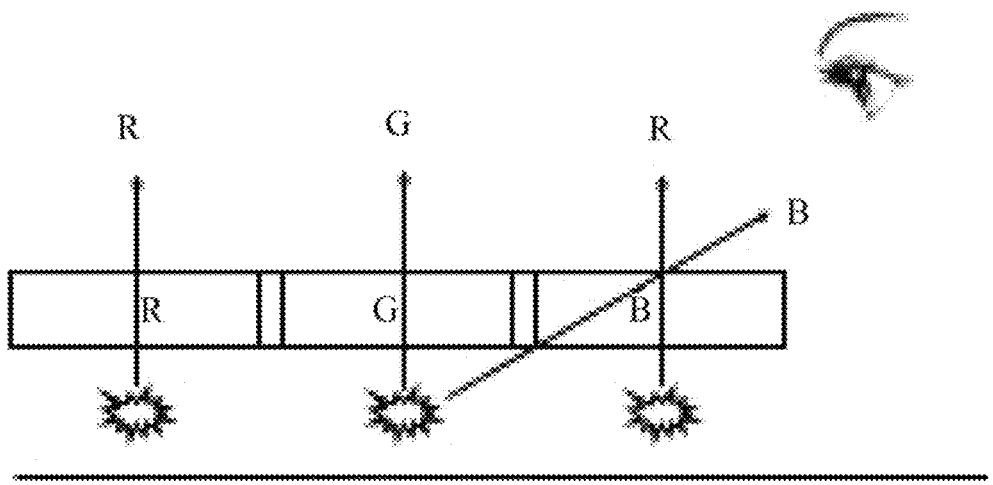
FIG. 2B illustrates a schematic diagram that a cross color problem appears in the pixel structure as shown in FIG. 2A.

In another aspect, a pixel arrangement in some OLED display devices (for example, the Micro OLED display devices) will adopt a pixel structure design that RGB (Red, Green, Blue) three-color sub-pixels form a pixel as shown in FIG. 2A. According to whether sub-pixel rendering is adopted, the pixel arrangement may alternatively be divided into a BV3 arrangement and a Delta RGB arrangement. However, these two pixel arrangements will cause the problems of high power consumption and low luminous brightness in most OLED display devices, and, as shown in FIG. 2B, the cross color problem will occur when a viewing angle is large.

In yet another aspect, in some OLED display devices (for example, the Micro OLED display devices), the BM has not been introduced to prevent the cross color problem between RGBs due to a material problem of the BM, and an effect of preventing large viewing angle cross color is achieved only by the Overlay between the CFs (for example, the RGB color photoresist). However, when the viewing angle is large, the CF Overlay between the RGBs has little effect on preventing cross color. So, some OLED display devices (for example, the Micro OLED display devices) have a problem of serious large viewing angle cross color. Moreover, the introduction of the BM or the CF Overlay will reduce the aperture ratio, which aggravates the problem of low luminous brightness of some OLED display devices.

The embodiments of the disclosure provide a pixel structure. The pixel structure may include: a plurality of pixel rows and a plurality of pixel columns. Each pixel row includes: sub-pixels of four different colors. The plurality of pixel columns include: a plurality of first pixel columns and a plurality of second pixel columns arranged alternately. Each of the first pixel columns includes: sub-pixels of three of the four different colors. Each of the second pixel columns includes: sub-pixels of another color other than the three of the four different colors. Thus, according to the pixel structure provided by the embodiments of the disclosure, a second pixel column formed by arranging sub-pixels of only one color other than the three colors is introduced between two first pixel columns formed by arranging sub-pixels of three colors. Thus the sub-pixels of another color other than the three colors are introduced between the two columns of first pixel columns, so that the sub-pixels of another color other than the three colors may separate the sub-pixels of the three colors. Therefore, uniform mixing of four different colors can be achieved, the color mixing effect can be improved, and the luminous brightness can be improved. Moreover, when the viewing angle in a first direction (i.e., the direction of the pixel row) is offset, because the sub-pixels of another color other than the three colors are on both sides of the sub-pixels of the three colors, large-angle light emitted from the sub-pixels of the three colors will only enter the sub-pixels of another color other than the three colors and will not cross into the sub-pixels of the three colors, which can avoid a serious cross color problem, so that the setting of the BM or the CF Overlay can be avoided, the aperture ratio being reduced can be avoided, the luminous brightness of the device can be improved, and the transmittance and luminous efficiency of the device can be improved. Therefore, the quality of a display picture can be improved.

The embodiments of the disclosure further provide a pixel structure. The pixel structure may include: a plurality of pixels arranged in an array. Each pixel may include: sub-pixels of four different colors. In each pixel, the ratio of the numbers of the sub-pixels of four different colors may be 1:1:1:3. Thus, according to the pixel structure provided by the embodiments of the disclosure, the sub-pixels of four different colors are separated to form a pixel, which can improve the brightness of each pixel, achieve four different colors being mixed uniformly, improve the color mixing effect, improve the luminous brightness, and improve the quality of the display picture. Here, when the total quantity of the sub-pixels of the pixel structure is not an integer multiple of 6, "the ratio of the numbers of the sub pixels of the four different colors in each pixel may be 1:1:1:3" described in the embodiments of the disclosure may refer to that the ratio of the numbers of the sub pixels of the four different colors in each pixel is approximately 1:1:1:3. For example, when there is a dummy pixel on the periphery of the AA area of the display device, at this moment, the situation that individual pixels cannot meet the ratio of the numbers of the sub-pixels of the four different colors being 1:1:1:3 may occur.

The embodiments of the disclosure further provide a pixel structure. The pixel structure may include: a plurality of repeating units arranged in an array. Each repeating unit may include: three pixels arranged side by side. Each pixel may include: sub-pixels of four different colors. The arrangement positions of the sub-pixels of the four different colors in the three pixels are different. Thus, according to the pixel structure provided by the embodiments of the disclosure, the sub-pixels of four different colors are regarded as a pixel, and the three pixels with the sub-pixels of the four different colors arranged differently are regarded as a repeating unit, which can improve the brightness of each pixel. Four different colors can be mixed uniformly, which can improve the color mixing effect, can improve the luminous brightness, can ensure the uniformity of display, and can improve the quality of the display picture.

In an illustrative embodiment, the sub-pixels of the four different colors may include: Red (R) sub-pixels, Blue (B) sub-pixels, Green (G) sub-pixels, and White (W) sub-pixels, or the sub-pixels of the four different colors may include: Red (R) sub-pixels, Blue (B) sub-pixels, Green (G) sub-pixels, and Yellow (Y) sub-pixels, or, sub-pixels of four different colors may be matched with other colors. Here, the embodiments of the disclosure do not limit this.

In an illustrative embodiment, the sub-pixels of another color other than the three colors of the four different colors may include: White (W) sub-pixels, Yellow (Y) sub-pixels, or the sub-pixels of other colors, which is not limited to the embodiments of the disclosure here.

In an illustrative embodiment, taking that the sub-pixels of the four different colors may include: Red (R) sub-pixels, Blue (B) sub-pixels, Green (G) sub-pixels, and White (W) sub-pixels as an example, the sub-pixels of the three colors of the four different colors may include: Red (R) sub-pixels, Blue (B) sub-pixels, Green (G) sub-pixels, and the sub-pixels of another color other than the three colors of the four different colors may be White (W) sub-pixels.

Figure 3:
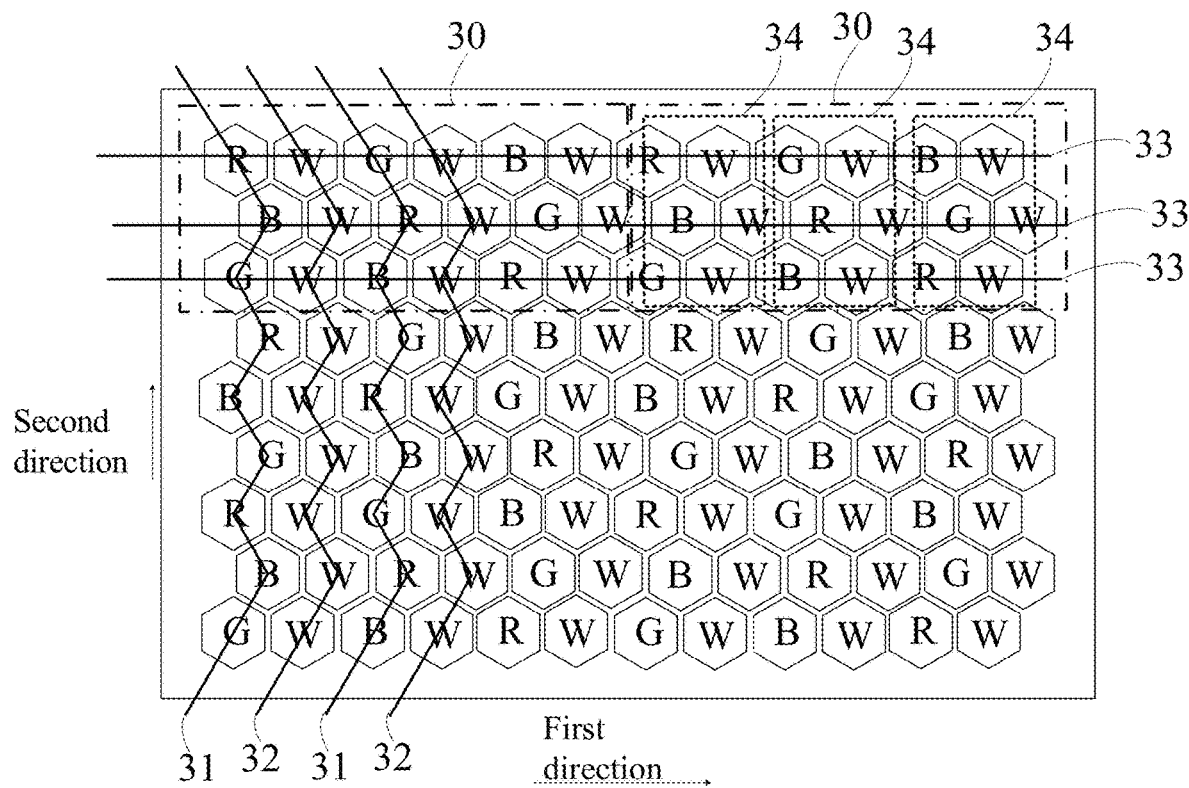
FIG. 3 illustrates a structural schematic diagram of the pixel structure in an illustrative embodiment of the disclosure.
Figure 4:
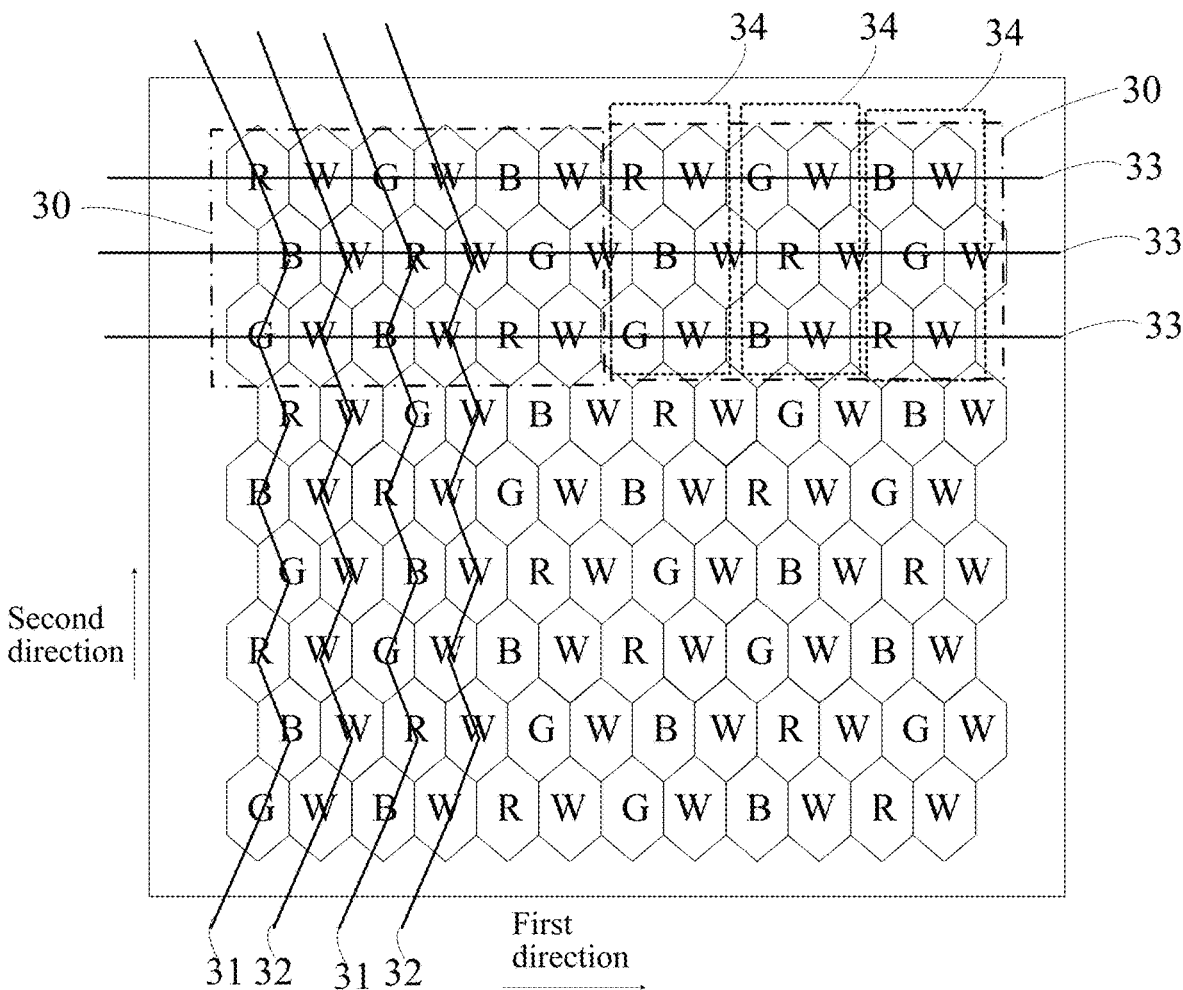
FIG. 4 illustrates another structural schematic diagram of the pixel structure in an illustrative embodiment of the disclosure.

FIG. 3 illustrates a structural schematic diagram of the pixel structure in the illustrative embodiment of the disclosure. FIG. 4 illustrates another structural schematic diagram of the pixel structure in the illustrative embodiment of the disclosure. In FIG. 3 and FIG. 4, taking the sub-pixels of the three colors of the four different colors including: Red (R) sub-pixels, Blue (B) sub-pixels, Green (G) sub-pixels, and the sub-pixels of another color other than the three colors of the four different colors being White (W) sub-pixels as an example, nine pixel rows 33, and six first pixel columns 31 and six second pixel columns 32 arranged alternately in the pixel structure are illustrated, and six repeating units 30 in the pixel structure are illustrated. Each repeating unit 30 includes three pixels 34. Each pixel 34 includes three White (W) sub-pixels, one Red (R) sub-pixel, one Blue (B) sub-pixel, and one Green (G) sub-pixel. Here, the pixel structure provided by the embodiments of the disclosure includes, but is not limited to, the abovementioned manner. For example, the positions of the Red (R) sub-pixel, the Blue (B) sub-pixel, and the Green (G) sub-pixel in the repeating unit as shown in FIG. 3 and FIG. 4 may be exchangeable. For example, the positions of the sub-pixels of the four different colors of the pixel structure as shown in FIG. 3 and FIG. 4 may be exchangeable. For example, the colors of the sub-pixels of the four different colors of the pixel structure as shown in FIG. 3 and FIG. 4 may be exchangeable. The illustrative embodiment of the disclosure does not limit this.

The pixel structure in the embodiments of the disclosure is described with reference to FIG. 3 and FIG. 4.

In an illustrative embodiment, as shown in FIG. 3 and FIG. 4, the first pixel column 31 may be formed by arranging Red (R) sub-pixels, Blue (B) sub-pixels, and Green (G) sub-pixels.

Figure 5:
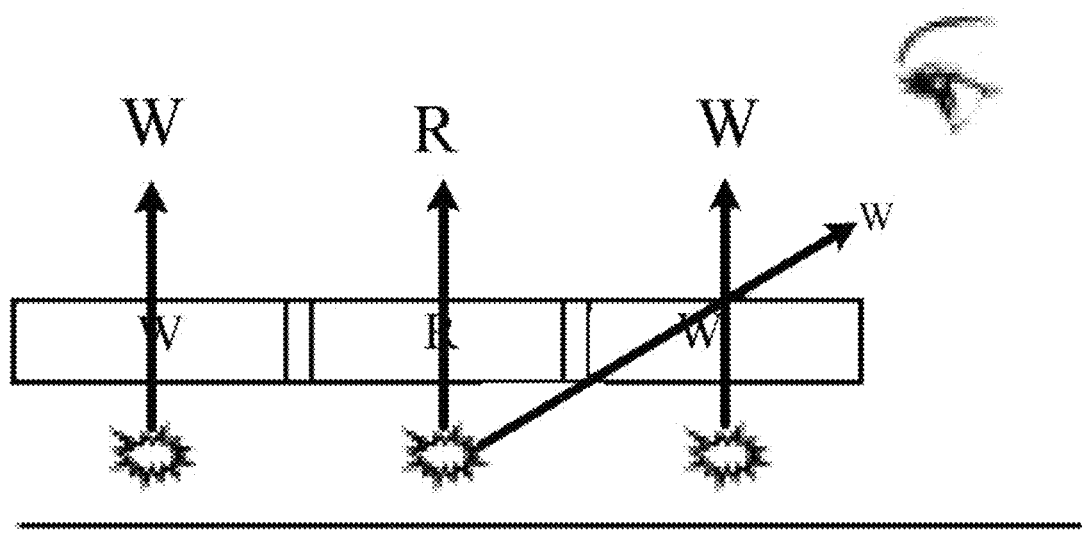
FIG. 5 illustrates a schematic diagram that the pixel structure as shown in FIG. 3 or FIG. 4 can avoid the cross color problem.

The second pixel column 32 may be formed by only arranging White (W) sub-pixels. This, in the pixel structure, in a first direction (i.e., row direction), the sub-pixels of any two colors of the Red (R) sub-pixels, the Blue (B) sub-pixels, and the Green (G) sub-pixels may be separated by the White (W) sub-pixels (for example, in the pixel row 33, the White (W) sub-pixels may separate the Red (R) sub-pixels from the Green (G) sub-pixels, separate the Green (G) sub-pixels from the Blue (B) sub-pixels, and separate the Blue (B) sub-pixels from the Red (R) sub-pixels). Thus, when a viewing angle in the first direction is offset, as shown in FIG. 5, large-angle light emitted from the Red (R) sub-pixels, the Blue (B) sub-pixels, and the Green (G) sub-pixels can only enter adjacent White (W) sub-pixels without crossing into other sub-pixels, so that a cross color problem can be avoided. Moreover, the color mixing effect can be improved, the luminous brightness can be improved, and the quality of a display picture can be improved.

In an illustrative embodiment, as shown in FIG. 3 and FIG. 4, each pixel row 33 may be in a linear shape.

In an illustrative embodiment, each pixel row may be in a bent line shape. For example, as shown in FIG. 3 and FIG. 4, the first pixel columns 31 and the second pixel columns 32 arranged alternately are all in bent line shapes.

In an illustrative embodiment, the quantities of the sub-pixels of three colors in each first pixel column are the same. For example, as shown in FIG. 3 and FIG. 4, the quantities of the Red (R) sub-pixels, the Blue (B) sub-pixels, and the Green (G) sub-pixels in the first pixel column 31 are the same.

In an illustrative embodiment, as shown in FIG. 3 and FIG. 4, the total quantity of the sub-pixels of the second pixel column 32 is equal to the total quantity of the sub-pixels of the first pixel column 31.

In an illustrative embodiment, the ratio of the quantities of the sub-pixels of the four different colors in each pixel row may be 1:1:1:3. For example, as shown in FIG. 3 and FIG. 4, the quantities of the Red (R) sub-pixels, the Blue (B) sub-pixels, the Green (G) sub-pixels, and the White (W) sub-pixels in the pixel row 33 is 1:1:1:3. Here, when the total quantity of the sub-pixels of the pixel structure is not an integer multiple of 6, "the ratio of the quantities of the sub pixels of the four different colors in each pixel row is 1:1:1:3" described in the embodiments of the disclosure may refer to that the ratio of the quantities of the sub pixels of the four different colors in each pixel row is approximately 1:1:1:3. For example, when there is a dummy pixel on the periphery of the AA area of the display device, at this moment, the situation that the ratio of the quantities of the sub-pixels of the four different colors in the pixel row cannot satisfy the ratio (i.e., 1:1:1:3) may occur.

In an illustrative embodiment, the colors of adjacent sub-pixels in each pixel row are not the same. For example, as shown in FIG. 3 and FIG. 4, the White (W) sub-pixels may separate the sub-pixels of any two different colors of the Red (R) sub-pixels, the Blue (B) sub-pixels, and the Green (G) sub-pixels, which can prevent any two of the Red (R) sub-pixels, the Blue (B) sub-pixels, and the Green (G) sub-pixels from being adjacent to each other. Thus, when a viewing angle in the first direction (the direction of the pixel row) is offset, as shown in FIG. 5, because any one of the Red (R) sub-pixels, the Blue (B) sub-pixels, and the Green (G) sub-pixels is adjacent to the White (W) sub-pixels, the large-angle light emitted from the Red (R) sub-pixels, the Blue (B) sub-pixels, and the Green (G) sub-pixels can only enter the adjacent White (W) sub-pixels without crossing into the sub-pixels of other colors. Thus, a serious cross color problem can be avoided, the color mixing effect can be improved, the luminous brightness can be improved, and the quality of a display picture can be improved.

In an illustrative embodiment, as shown in FIG. 3 and FIG. 4, the first pixel column 31 may include any one or more of the following arrangements: Red (R) sub-pixels, Blue (B) sub-pixels, and Green (G) sub-pixels arranged alternately in turn, Green (G) sub-pixels, Red (R) sub-pixels, and Blue (B) sub-pixels arranged alternately in turn, and Blue (B) sub-pixels, Green (G) sub-pixels, and Red (R) sub-pixels arranged alternately in turn. For example, as shown in FIG. 3 and FIG. 4, the pixel structure includes: a first pixel column 31 in the abovementioned three arrangement manners arranged alternately in turn, so that the Red (R) sub-pixels, the Blue (B) sub-pixels, and the Green (G) sub-pixels may be arranged uniformly in a repeating unit 30, which can improve the luminous brightness of the device, can improve the transmittance and the luminous efficiency of the device, can improve the color mixing effect, and can improve the quality of the display picture.

In an illustrative embodiment, as shown in FIG. 3 and FIG. 4, the colors of adjacent sub-pixels in each first pixel column 31 are different.

In an illustrative embodiment, the colors of adjacent sub-pixels in adjacent first pixel columns of a plurality of pixel columns in the pixel structure are different. For example, as shown in FIG. 3 and FIG. 4, a first first pixel column 31 includes: Red (R) sub-pixels, Blue (B) sub-pixels, and Green (G) sub-pixels arranged alternately in turn; a second first pixel column 31 includes: Green (G) sub-pixels, Red (R) sub-pixels, and Blue (B) sub-pixels arranged alternately in turn; thus, in the first direction, the Red (R) sub-pixels in the first first pixel column 31 is adjacent to the Green (G) sub-pixels in the second first pixel column 31; the Blue (B) sub-pixels in the first first pixel column 31 is adjacent to the Red (R) sub-pixels in the second first pixel column 31; and the Green (G) sub-pixels in the first first pixel column 31 is adjacent to the Blue (B) sub-pixels in the second first pixel column 31.

In an illustrative embodiment, the shape of each sub-pixel may be a hexagon, and each of the six internal angles of the hexagon is 120°. Thus, a plurality of sub-pixels in the pixel structure are arranged closely, which can improve the aperture ratio, can improve the luminous brightness, and can reduce the power consumption.

In an illustrative embodiment, taking the shape of each sub-pixel being a hexagon as an example, three groups of opposite sides of the hexagon are parallel to each other, and the length of at least two groups of the opposite sides are equal. Thus, a plurality of sub-pixels in the pixel structure are arranged closely, which can improve the aperture ratio, can improve the luminous brightness, and can reduce the power consumption.

Figure 6:
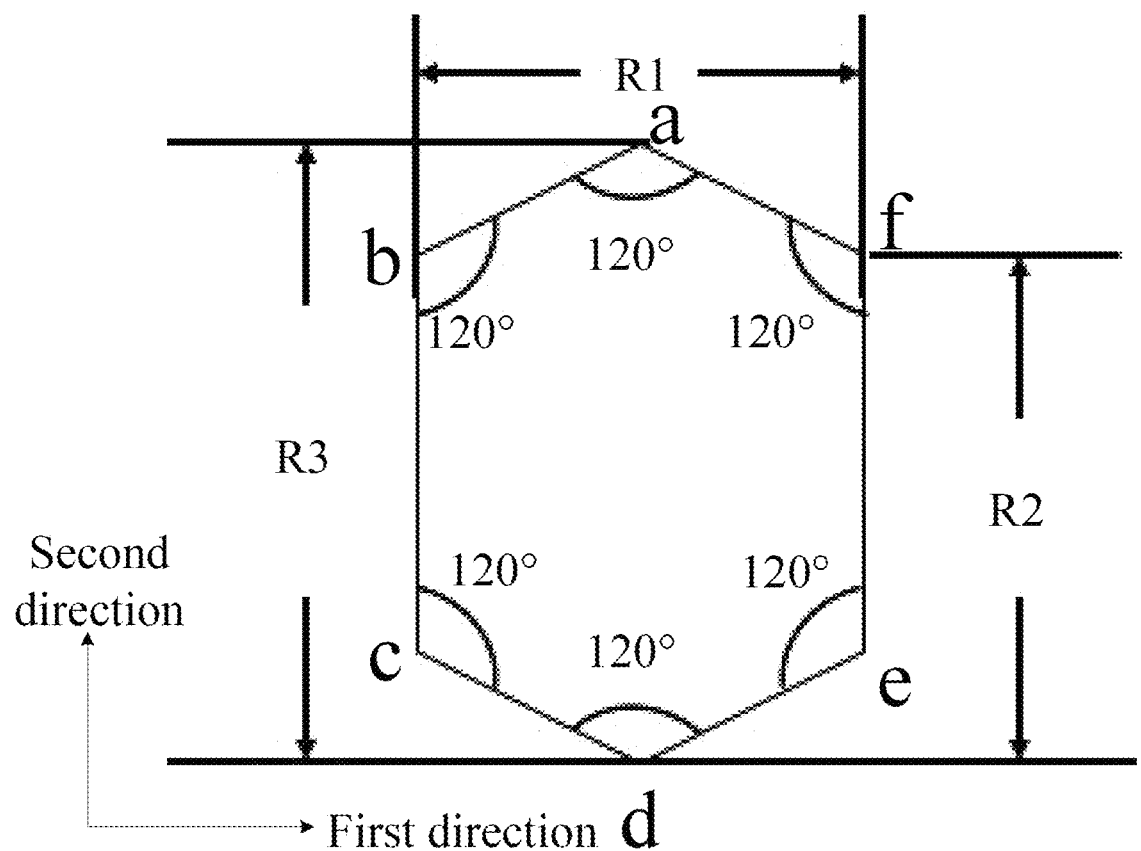
FIG. 6 illustrates a structural schematic diagram of a sub-pixel in the pixel structure in an illustrative embodiment of the disclosure.

For example, as shown in FIG. 3, the shape of each sub-pixel may be a regular hexagon, three groups of opposite sides of the regular hexagon are parallel to each other, and the length of the six sides are equal. For another example, as shown in FIG. 4, the shape of each sub-pixel may be a parallel hexagon, three groups of opposite sides of the parallel hexagon are parallel to each other, and the length of two groups of the opposite sides are equal. For example, as shown in FIG. 6, the parallel hexagon may include: a first side (side ab), a second side (side bc), a third side (side cd), a fourth side (side de), a fifth side (side ef), and a sixth side (side fa), herein the first group of opposite sides includes the first side (side ab) and the fourth side (side de) parallel to each other; the second group of opposite sides includes the second side (side bc) and the fifth side (side ef) parallel to each other; and the third group of opposite sides includes the third side (side cd) and the sixth side (side fa) parallel to each other. The length of the first group of opposite sides and the third group of opposite sides may be equal. FIG. 6 illustrates by taking one sub-pixel as an example.

In an illustrative embodiment, taking six sub-pixels being a pixel, and three pixels arranged side by side being a repeating unit as an example, as shown in FIG. 3 and FIG. 4, the pixel structure may include: a plurality of repeating units 30 arrayed in the first direction (row direction) and the second direction (column direction). Each row of each repeating unit 30 includes: one red (R) sub-pixel, one Blue (B) sub-pixel, one Green (G) sub-pixel, and three White (W) sub-pixels. Each repeating unit 30 may include: three pixels 34 arranged side by side, and the sub-pixel arrangement of three pixels 34 in each repeating unit 30 is different. Each pixel 34 may include: one Red (R) sub-pixel, one Blue (B) sub-pixel, one Green (G) sub-pixel and three White (W) sub-pixels. The first column of each pixel 34 includes: one Red (R) sub-pixel, one Blue (B) sub-pixel and one Green (G) sub-pixel arranged in a bent line shape. The second column of each pixel 34 includes: three White (W) sub-pixels arranged in a bent line shape. The shape of each sub-pixel is a hexagon, and each of the six internal angles of the hexagon is 120°.

Thus, in one aspect, one Red (R) sub-pixel, one Blue (B) sub-pixel, one Green (G) sub-pixel, and three White (W) sub-pixels are regarded as one pixel, which can improve the brightness of each pixel, can achieve uniform color mixing of the sub-pixels of a plurality of colors, and improve the quality of the display picture. In another aspect, each row of each repeating unit 30 includes: one Red (R) sub-pixel, one Blue (B) sub-pixel, one Green (G) sub-pixel, and three White (W) sub-pixels. The sub-pixel arrangement of three pixels 34 in each repeating unit 30 is different, and each pixel 34 may include: one Red (R) sub-pixel, one Blue (B) sub-pixel, one Green (G) sub-pixel, and three White (W) sub-pixels. The first column of each pixel 34 includes: one Red (R) sub-pixel, one Blue (B) sub-pixel, and one Green (G) sub-pixel arranged in a bent line shape. The second column of each pixel 34 includes: three White (W) sub-pixels arranged in a bent line shape, which can improve the brightness of each repeating unit, can achieve the uniform color mixing of the sub-pixels of a plurality of colors, and improve the quality of the display picture. In yet another aspect, because the shape of each sub-pixel is a hexagon and each of the six internal angles of the hexagon is 120°, a plurality of sub-pixels in the pixel structure can be arranged closely, the aperture ratio can be improved, the luminous brightness can be higher, and the power consumption can be reduced. Then, applying the pixel structure provided in the illustrative embodiment of the disclosure to a display product, the luminous brightness of the display product can be improved, and the power consumption of the display product can be reduced. Therefore, a larger dynamic display range can be achieved. Then, the pixel structure may be applied to the field of Head Up Display (HUD), the field of transparent display, the field of Augmented Reality (AR) display, the Virtual Reality (VR) display, or the like. Compared with the pixel structure as shown in FIG. 2A, the luminous brightness of the pixel structure provided in the illustrative embodiment of the disclosure can be increased by about 1.5 to 2 times.

In an illustrative embodiment, as shown in FIG. 3 and FIG. 4, each repeating unit 30 may include: a first pixel, a second pixel, and a third pixel arranged in the first direction in turn. A first row of the first pixel may include: a Red (R) sub-pixel and a White (W) sub-pixel arranged in the first direction in turn. A second row of the first pixel may include: a Blue (B) sub-pixel and a White (W) sub-pixel arranged in the first direction in turn. A third row of the first pixel may include: a Green (G) sub-pixel and a White (W) sub-pixel arranged in the first direction in turn. A first row of the second pixel may include: a Green (G) sub-pixel and a White (W) sub-pixel arranged in the first direction in turn. A second row of the second pixel may include: a Red (R) sub-pixel and a White (W) sub-pixel arranged in the first direction in turn. A third row of the second pixel may include: a Blue (B) sub-pixel and a White (W) sub-pixel arranged in the first direction in turn. A first row of the third pixel may include: a Blue (B) sub-pixel and a White (W) sub-pixel arranged in the first direction in turn. A second row of the third pixel may include: a Green (G) sub-pixel and a White (W) sub-pixel arranged in the first direction in turn. A third row of the third pixel may include: a Red (R) sub-pixel and a White (W) sub-pixel arranged in the first direction in turn. Thus, there are the same quantity of Red (R) sub-pixels, Blue (B) sub-pixels, and Green (G) sub-pixels on each row of the repeating unit, and each Red (R) sub-pixel, each Blue (B) sub-pixel, and each Green (G) sub-pixel may be adjacent to the White (W) Sub-pixel, so that the luminous brightness of the device can be improved, the transmittance and the light efficiency of the device can be improved, the color mixing can be ensured to be very even, and the quality of the display picture can be improved. In addition, the large angle light emitted from any one of the Red (R) sub-pixel, the Blue (B) sub-pixel, and the Green (G) sub-pixel can only enter the adjacent White (W) sub-pixel and cannot cross into other sub-pixels, so that the problem of cross color can be avoided, the color mixing effect is better, the quality of the display picture is better, and the luminous brightness is higher.

In an illustrative embodiment, the arrangement positions of the first pixel, the second pixel, and the third pixel in the pixel structure shown in FIG. 3 and FIG. 4 may be exchangeable. For example, each repeating unit 30 in FIG. 3 may include: a second pixel, a first pixel, and a third pixel arranged in the first direction in turn. Here, the embodiment of the disclosure does not limit this.

In an illustrative embodiment, in each repeating unit, the sizes of a plurality of sub-pixels of the same color are the same. For example, as shown in FIG. 3 and FIG. 4, in each repeating unit 30, the sizes of three Red (R) sub-pixels are the same, or the sizes of three Blue (B) sub-pixels are the same, or the sizes of three Green (G) sub-pixels are the same, or the sizes of the nine White (W) sub-pixels are the same. Thus, the uniformity of display can be ensured.

In an illustrative embodiment, in each repeating unit, the shapes, the sizes, and the placement angles of all sub-pixels are the same. For example, as shown in FIG. 3 and FIG. 4, in each repeating unit 30, the shapes, the sizes, and the placement angles of 18 sub-pixels are the same. Thus, the uniformity of display can be ensured.

In an illustrative embodiment, the luminous efficiency and the lifetime of the sub-pixels of different colors are different. Therefore, in one repeating unit, the area corresponding to the sub-pixels of different colors may be set according to the luminous efficiency and the service life of the sub-pixels of different colors, so as to improve the brightness of the product and prolong the service life of the product.

For example, the area proportion of the four sub-pixels of the Red (R) sub-pixels, the Blue (B) sub-pixels, the Green (G) sub-pixels, and the White (W) sub-pixels in a repeating unit can be flexibly adjusted according to a brightness improvement ratio design requirement and a lifetime design requirement.

For example, because the luminous efficiency of the Blue (B) sub-pixel under the same current intensity is lower than that of the Green (G) sub-pixel under the same current intensity and that of the Red (R) sub-pixel under the same current intensity, and the ratio of the quantities of the Red (R) sub-pixels, the Green (G) sub-pixels, and the Blue (B) sub-pixel in a repeating unit is 1:1:1, so that the area of the Blue (B) sub-pixels may be increased, i.e., the area of the Blue (B) sub-pixels may be set to be greater than that of the Red (R) sub-pixels and to be greater than that of the Green (G) sub-pixels. Thus, the brightness and the lifetime of the pixel structure can be improved.

For example, the contribution values of the sub-pixels of three colors of RGB to the brightness under white light are: the Red (R) sub-pixels account for about 20% to 25%, the Green (G) sub-pixels account for about 50% to 60%, and the Blue (B) sub-pixels account for about 20% to 25%. The lifetime of organic materials of three colors of RGB is: the lifetime of the Red (R) sub-pixels is about 17000 hours to 18000 hours, the lifetime of the Green (G) sub-pixels is about 26000 hours to 27000 hours, and the lifetime of the Blue (B) sub-pixel is about 6000 hours to 7000 hours. Therefore, the area ratio of the Red (R) sub-pixels, the Green (G) sub-pixels, and the Blue (B) sub-pixels may be set to be about 1:1:2.

Figure 7:
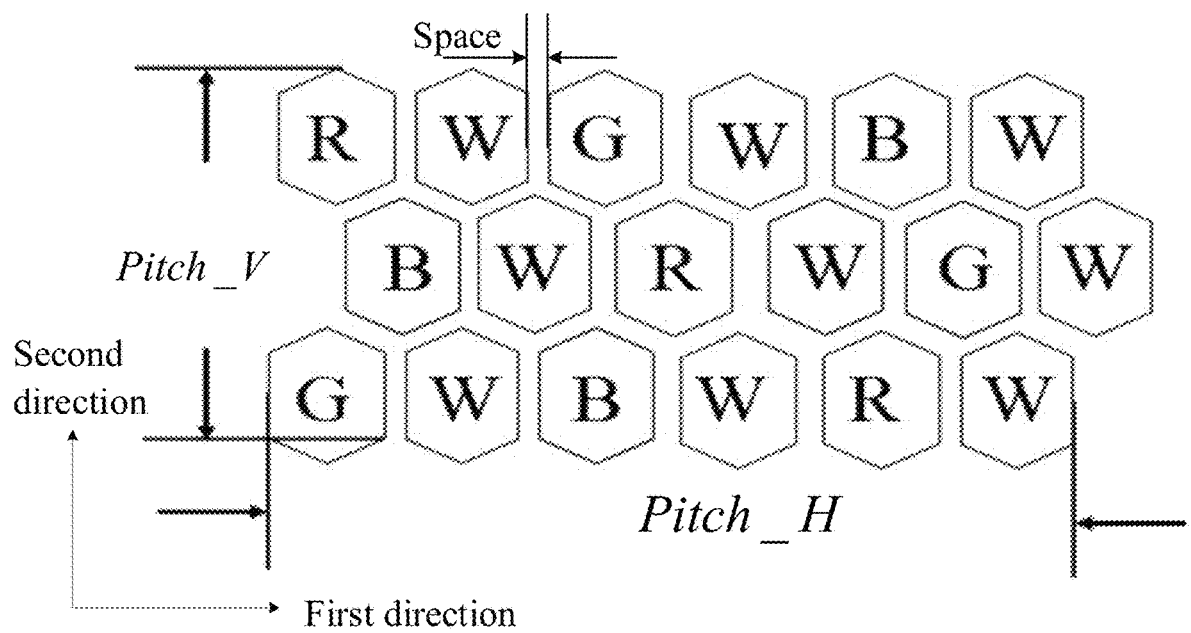
FIG. 7 illustrates a structural schematic diagram of a repeating unit of the pixel structure in an illustrative embodiment of the disclosure.

In an illustrative embodiment, taking the shape of each sub-pixel being a hexagon with three groups of opposite sides in parallel, at least two groups of opposite sides of equal length, and each of six internal angles of 120° as an example, the length of each repeating unit is 3 times the width of each repeating unit. For example, as shown in FIG. 7, the length of each repeating unit may refer to the equivalent length (Pitch_H) in the first direction, and the width of each repeating unit may refer to the equivalent length (Pitch_V) in the second direction. Here, FIG. 7 illustrates by taking one repeating unit as an example.

Figure 8:
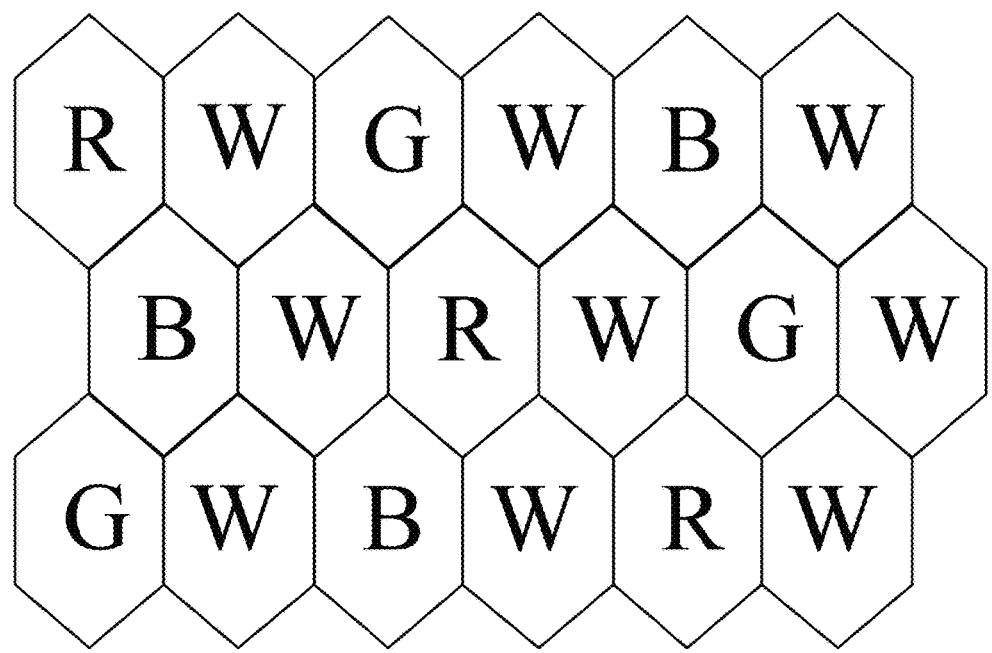
FIG. 8 illustrates another structural schematic diagram of the repeating unit of the pixel structure in an illustrative embodiment of the disclosure.

In an illustrative embodiment, as shown in FIG. 7 and FIG. 8, the minimum space between any two adjacent sub-pixels may be equal. Here, the minimum distance Space between two adjacent sub-pixels may represent the width of the BM or the CF overlay.

Figure 9:
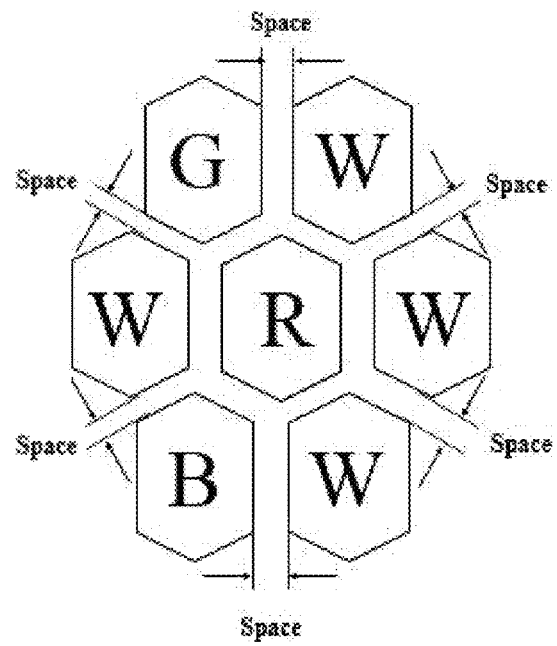
FIG. 9 illustrates a structural schematic diagram of part sub-pixels in the pixel structure in an illustrative embodiment of the disclosure.

In an illustrative embodiment, as shown in FIG. 8, the minimum Space between any two adjacent sub-pixels may be equal to 0, i.e., Space=0, which indicates that there is no BM or CF overlay. Or, as shown in FIG. 7, the minimum Space between any two adjacent sub-pixels may be greater than 0, i.e., Space=X μm (microns), (X≠0 and X>0) represents that the width of the BM or the CF overlay is X μm. For example, as shown in FIG. 9, the minimum Space between any two adjacent sub-pixels may be completely consistent, i.e., the spacing between the six sides of any two hexagonal sub-pixels may be X μm. For example, the minimum Space between any two adjacent sub-pixels in the same repeating unit may be about 0.6 μm.

In an illustrative embodiment, as shown in FIG. 8, taking that the shapes, the sizes, and the placement angles of all sub-pixels in each repeating unit may be the same, and the minimum Space between any two adjacent sub-pixels is equal to 0 as example, and taking the shape of the sub-pixel being a parallel hexagon as an example, as shown in FIG. 6, the width R1 of the sub-pixel may refer to the minimum distance between the second side (side bc) and the fifth side (side ef) of the sub-pixel in the first direction, the equivalent length R2 of the sub-pixel may refer to the minimum distance between a vertex d and a vertex f of the sub-pixel in the second direction, and the length R3 of the sub-pixel may refer to the minimum distance between a vertex d and a vertex a of the sub-pixel in the second direction, so that the length of the repeating unit and the width of the repeating unit may be as shown in Formula (2) and Formula (3): the length Pitch_H of the repeating unit may be 6 times the width R1 of the sub-pixel, and the width Pitch_V of the repeating unit may be the sum of 2 times the equivalent length R2 of the sub-pixel and the length R3 of the sub-pixel.

$$\text{Pitch\_}H = 6 \times R1 \qquad \text{Formula (2);}$$

$$\text{Pitch\_}V = 2 \times R2 + R3 \qquad \text{Formula (3);}$$

Herein, Pitch_H represents the length of the repeating unit, Pitch_V represents the width of the repeating unit, R1 represents the width of the sub-pixel, R2 represents the equivalent length of the sub-pixel, and R3 represents the length of the sub-pixel.

In an illustrative embodiment, as shown in FIG. 7, taking that the shapes, the sizes, and the placement angles of all sub-pixels in each repeating unit may be the same, and the minimum Space between any two adjacent sub-pixels is greater than 0 as example, and taking the shape of the sub-pixel being a parallel hexagon as an example, as shown in FIG. 6, the width R1 of the sub-pixel may refer to the minimum distance between the second side (side bc) and the fifth side (side ef) of the sub-pixel in the first direction, the equivalent length R2 of the sub-pixel may refer to the minimum distance between a vertex d and a vertex f of the sub-pixel in the second direction, and the length R3 of the sub-pixel may refer to the minimum distance between a vertex d and a vertex a of the sub-pixel in the second direction, so that the length of the repeating unit and the width of the repeating unit may be as shown in Formula (4) and Formula (5).

$$\text{Pitch\_}H = 3 \times W_{R1} + R_{R1} + G_{R1} + B_{R1} \qquad \text{Formula (4);}$$

$$\text{Pitch\_}V = R_{R3} + G_{R2} + B_{R3} + \text{Space} \times \text{sqrt}(3) \qquad \text{Formula (5);}$$

Herein, Pitch_H represents the length of the repeating unit (i.e. the equivalent distance of the repeating unit in the first direction), $W_{R1}$ represents the width of the White (W) sub-pixel, $R_{R1}$ represents the width of the Red (R) sub-pixel, $G_{R1}$ represents the width of the Green (G) sub-pixel, $B_{R1}$ represents the width of the Blue (B) sub-pixel, and Space represents the minimum distance between any two adjacent sub-pixels, Pitch_V represents the width of the repeating unit (i.e., the equivalent distance of the repeating unit in the second direction), $R_{R3}$ represents the length of the Red (R) sub-pixel, $G_{R2}$ represents the equivalent length of the White (W) sub-pixel, $B_{R3}$ represents the length of the Blue (B) sub-pixel, and sqrt(3) represents the square root of 3.

In an illustrative embodiment, the pixel structure may be set to satisfy one or more of the following five conditions: 1. Pitch_V=Pixel_Pitch, and Pitch_H=3×Pixel_Pitch, i.e., the length Pitch_H of each repeating unit is 3 times the width Pitch_V of each repeating unit, herein Pixel_Pitch represents the spacing between two pixels. 2. In a repeating unit, the sizes of the four sub-pixels of Red (R) sub-pixels, Green (G) sub-pixel, Blue (B) sub-pixel, and White (W) sub-pixel are the same, i.e., the sizes of the 18 sub-pixels in a minimum repeating unit are the same. 3. The minimum Space between any two adjacent sub-pixels is 0, i.e., there is no BM or CF overlay. 4. Formula (2) and Formula (3) are satisfied, i.e., the length Pitch_H of the repeating unit is 6 times the width R1 of the sub-pixel, and the width Pitch_V of the repeating unit may be the sum of 2 times the equivalent length R2 of the sub-pixel and the length R3 of the sub-pixel. 5. The shape of each sub-pixel is a hexagon, and each of the six internal angles of the hexagon is 120°. Thus, the aperture ratio can be improved. For example, the pixel structure may be set to satisfy the abovementioned five conditions at the same time, then the size of the sub-pixel calculated according to the abovementioned five conditions can make the pixel structure provided by the illustrative embodiment of the disclosure have a larger aperture ratio compared with the pixel arrangement design of closely arranged quadrangles, triangles and other hexagons. Therefore, the luminous brightness is higher.

In an illustrative embodiment, three pixels arranged side by side may form a repeating unit. On the basis of the repeating unit, the pixel structure arrangement of different resolutions may be achieved by arranging a repeating unit array. For example, if Full High Definition (FHD) display is set, and the resolution reaches 1920×1080, then, 1920/3=640 columns of repeating units may be set in the first direction (i.e. horizontal direction) and 1080 rows of repeating units may be set in the second direction (i.e. vertical direction), i.e., the resolution of FHD 1920×1080 can be achieved.

In an illustrative embodiment, the size used in arranging the repeating unit array may be determined according to the AA area and the resolution of the display device. For example, taking the pixel structure in the embodiment of the disclosure being applied to a 0.71 inch (inch) Full High Definition (FHD) display device as an example, because the size of the display screen is 0.71 inch, the resolution is FHD 1920×1080, the calculated spacing Pixel_Pitch between two pixels may be 8.1 μm, then, the length Pitch_H of each repeating unit calculated according to Formula (2) and Formula (3) may be 8.1 μm×3=24.3 μm, and the width Pitch_V of each repeating unit can be 8.1 km. Thus, when the repeating units are arrayed, the length Pitch_H of each repeating unit may be three times the width Pitch_V of each repeating unit.

In an illustrative embodiment, the pixel structure may further include: a plurality of data signal lines (Source Lines). Each second pixel column is controlled by one data signal line, and each first pixel column is controlled by two data signal lines. Thus, one data signal line can be reduced by using the pixel structure.

In an illustrative embodiment, the pixel structure may further include: a plurality of data signal lines. The sub-pixels of three of the four different colors in each pixel are controlled by two data signal lines, and the sub-pixels of another color other than three of the four different colors in each pixel are controlled by the same data signal line. Thus, one data signal line can be reduced by using the pixel structure.

In an illustrative embodiment, when the pixel structure is in a first display mode, the pixel structure may display by taking a pixel row group formed by two adjacent pixel rows as a unit. Or, when the pixel structure is in a second display mode, the pixel structure may display by taking a pixel column group formed by a first pixel column and a second pixel column as a unit. Or, when the pixel structure is in a third display mode, the pixel structure may display by taking each pixel as a unit.

Figure 10:
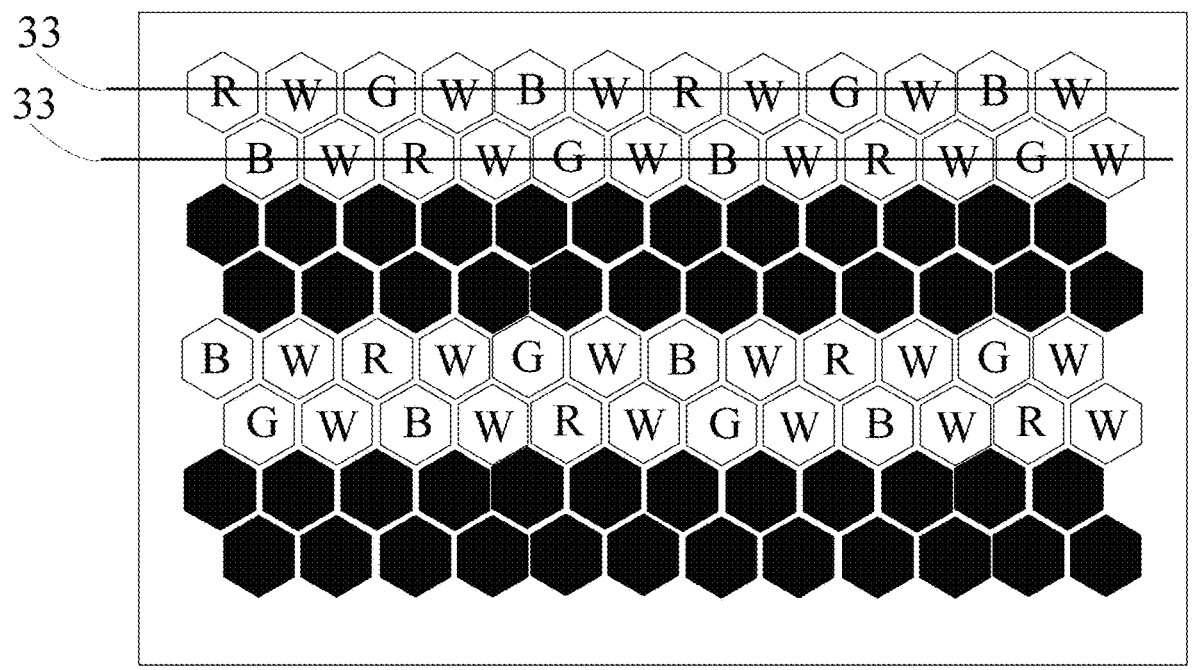
FIG. 10 illustrates a display schematic diagram of the pixel structure in an illustrative embodiment of the disclosure.
Figure 11:
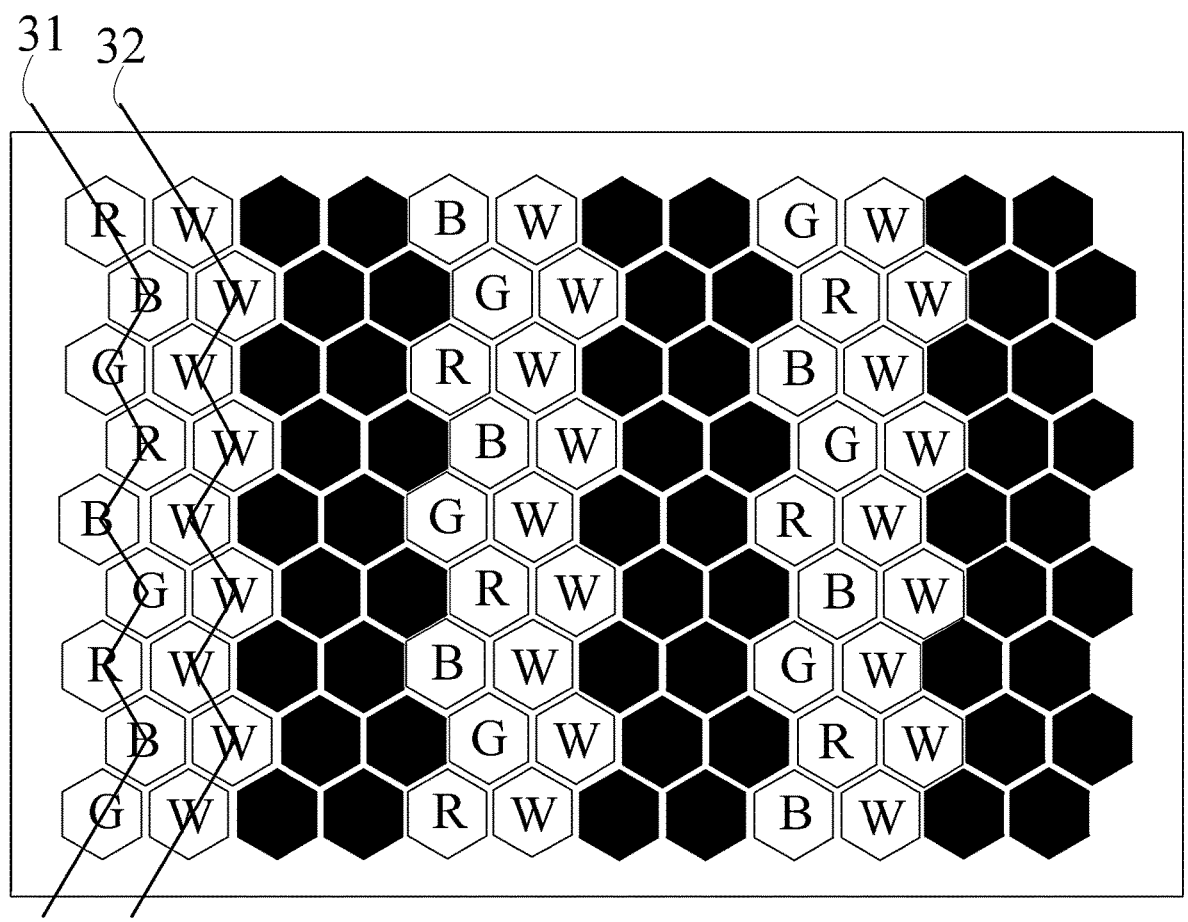
FIG. 11 illustrates another display schematic diagram of the pixel structure in an illustrative embodiment of the disclosure.
Figure 12:
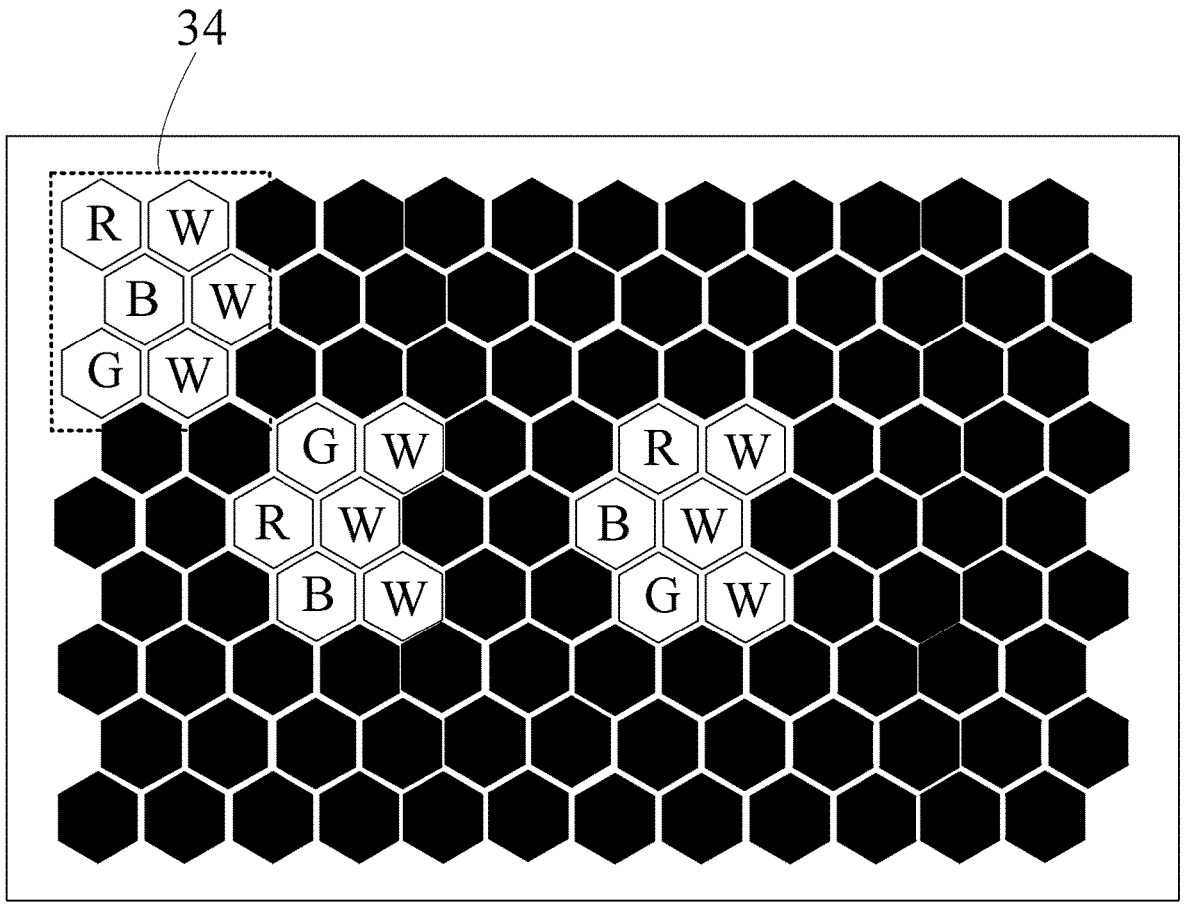
FIG. 12 illustrates yet another display schematic diagram of the pixel structure in an illustrative embodiment of the disclosure.

FIG. 10 illustrates a display schematic diagram of the pixel structure in the illustrative embodiment of the disclosure. FIG. 11 illustrates another display schematic diagram of the pixel structure in the illustrative embodiment of the disclosure. FIG. 12 illustrates yet another display schematic diagram of the pixel structure in the illustrative embodiment of the disclosure. The display modes of the pixel structure provided by the embodiments of the disclosure are described with reference to FIG. 10, FIG. 11, and FIG. 12. FIG. 10, FIG. 11, and FIG. 12 illustrate by taking the pixel structure shown in FIG. 3 as an example.

In an illustrative embodiment, when the pixel structure is in the first display mode, the pixel structure may display by taking a pixel row group formed by two adjacent pixel rows as a unit, herein, each pixel row includes: a White (W) sub-pixel, a Red (R) sub-pixel, a Blue (B) sub-pixel, and a Green (G) sub-pixel, and the White (W) sub-pixel separates any two of the Red (R) sub-pixel, the Blue (B) sub-pixel, and the Green (G) sub-pixel. For example, when horizontal black-and-white lines are displayed through RGBW pixel arrangement implemented by the repeating unit array, it can be achieved by four black-and-white lines as shown in FIG. 10. It can be seen from FIG. 10 that, when the horizontal black-and-white lines are displayed, a black line or a white line is not formed by pixel dots as shown in FIG. 10, but is achieved by two rows of sub-pixels. Thus, when black-and-white lines are displayed, the resolution will be higher, and the resolution of horizontal lines can be improved by ⅓. Here, FIG. 10 illustrates by taking displaying two white lines and two black lines as an example.

In an illustrative embodiment, when the pixel structure is in the second display mode, the pixel structure may display by taking a pixel column group formed by a first pixel column and a second pixel column as a unit, herein, the first pixel column in each pixel column group includes: a Red (R) sub-pixel, a Green (G) sub-pixel, and a Blue (B) sub-pixel; and the second pixel column in each pixel column group only includes a White (W) sub-pixel. For example, when vertical black-and-white lines are displayed through RGBW pixel arrangement implemented by the repeating unit array, it can be achieved in a vertical black-and-white line display mode as shown in FIG. 11. It can be seen from FIG. 11 that a white line or a black line includes two sub-pixels in the horizontal direction. The two sub-pixels may include a White (W) sub-pixel. Thus, the luminous brightness can be improved and the cross color problem can be avoided. The first pixel column includes the sub-pixels of three colors, i.e., the Red (R) sub-pixel, the Green (G) sub-pixel, and the Blue (B) sub-pixel, which can correspond to the display of color lines. Here, FIG. 11 illustrates by taking displaying three white lines and three black lines as an example. For example, as shown in FIG. 11, the Red (R) sub-pixel, the Green (G) sub-pixel, and the Blue (B) sub-pixel in the first pixel column in each pixel column group may give different display signals through two data signal lines, and all White (W) sub-pixels in the second pixel column in each pixel column group may give the same display signal through the same data signal line, thus a data signal line is saved by using the pixel structure.

In an illustrative embodiment, when the pixel structure is in third display mode, the pixel structure may display by taking each pixel as a unit, herein, each pixel may include: three White (W) sub-pixels, one Red (R) sub-pixel, one Blue (B) sub-pixel, and one Green (G) sub-pixel. For example, as shown in FIG. 12, when a pixel dot is displayed through RGBW pixel arrangement implemented by the repeating unit array, it can be achieved by three pixel dots as shown in FIG. 12. Here, FIG. 12 illustrates by taking that three pixel dots are lighted as an example. For example, as shown in FIG. 12, all White (W) sub-pixels in each pixel may give the same display signal through the same data signal line. The Red (R) sub-pixel, the Green (G) sub-pixel, and the Blue (B) sub-pixel in each pixel may give different display signals through two data signal lines. Thus, a data signal line is saved by using the pixel structure.

The embodiments of the disclosure further provide a driving method for a pixel structure. The pixel structure may be the pixel structure in the one or more of the abovementioned illustrative embodiments.

Figure 13:
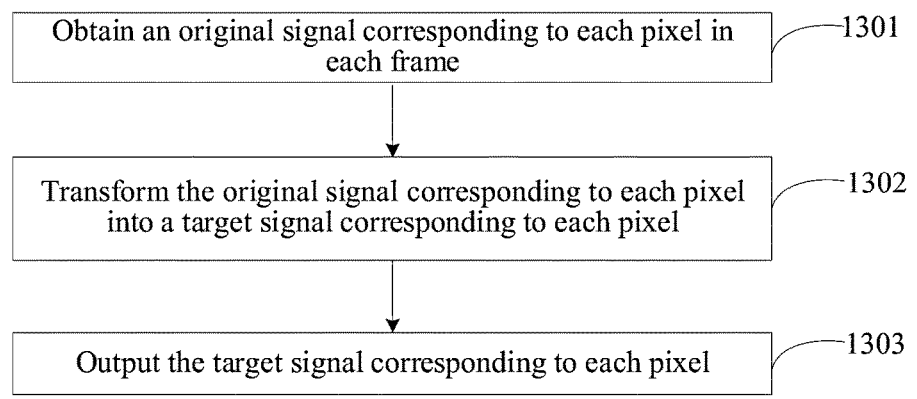
FIG. 13 illustrates a flow diagram of a driving method for the pixel structure in an illustrative embodiment of the disclosure.

FIG. 13 illustrates a flow diagram of a driving method for the pixel structure in the illustrative embodiment of the disclosure. As shown in FIG. 13, the driving method may include the following steps.

At S1301, an original signal corresponding to each pixel in each frame is acquired, herein, the original signal includes: original brightness values corresponding to sub-pixels of three of four different colors.

At S1302, an original signal corresponding to each pixel is transformed into a target signal corresponding to each pixel, herein, the target signal includes: target brightness values corresponding to the sub-pixels of four different colors.

At S1303, the target signal corresponding to each pixel is output.

For example, taking the sub-pixels of three of four different colors including: a Red (R) sub-pixel, a Blue (B) sub-pixel, and a Green (G) sub-pixel, and the sub-pixel of another color other than three of the four different colors being a White (W) sub-pixel as an example, generally, in each frame of standard video signal or image signal, the original signal corresponding to each pixel generally only includes an R signal (i.e., an original brightness value of the Red (R) sub-pixel in each pixel), a G signal (i.e., an original brightness value of the Green (G) sub-pixel in each pixel), and a B signal (i.e., an original brightness value of the Blue (B) sub-pixel in each pixel), and does not include a W signal (i.e., an original brightness value of the White (W) sub-pixel), then, with regard to driving the pixel structure of an RGBW pixel arrangement provided by an embodiment of the disclosure, after the original signal corresponding to each pixel in each frame of video or image is received, the received original signal corresponding to each pixel in each frame of video or image can be converted into a target signal corresponding to each pixel, and then the converted target signal corresponding to each pixel is output to the pixel structure, so that correct image display can be achieved. Herein, the target signal corresponding to each pixel may include an R signal (i.e., the total brightness value of the Red (R) sub-pixel in each pixel), a G signal (i.e., the total brightness value of the Green (G) sub-pixel in each pixel), a B signal (i.e., the total brightness value of the Blue (B) sub-pixel in each pixel), and a W signal (i.e., the total brightness value of the white (W) sub-pixel in each pixel). Thus, color display can be performed accurately in a driving method matched with the arrangement manner of the pixel structure.

In an illustrative embodiment, step 1302 may include the following S1401 to S1402.

At S1401, a maximum value and a minimum value of the original signal corresponding to each pixel are determined.

At S1402, the target signal corresponding to each pixel is determined on the basis of the maximum value and the minimum value of the original signal corresponding to each pixel.

Here, the maximum value of the original signal corresponding to each pixel refers to the maximum value of the original brightness values corresponding to the sub-pixels of three of the four different colors in the original signal corresponding to each pixel. The minimum value of the original signal corresponding to each pixel may refer to the minimum value of the original brightness values corresponding to the sub-pixels of three of the four different colors in the original signal corresponding to each pixel.

For example, taking that the original signal corresponding to each pixel generally only includes the R signal (i.e. the original brightness value of the Red (R) sub-pixel in each pixel), the G signal (i.e. the original brightness value of the Green (G) sub-pixel in each pixel), and the B signal (i.e. the original brightness value of the Blue (B) sub-pixel in each pixel), but does not include the W signal (i.e. the original brightness value of the White (W) sub-pixel) as an example, the maximum value of the original signal corresponding to each pixel may refer to the maximum value of the original brightness value of the Red (R) sub-pixel, the original brightness value of the Blue (B) sub-pixel, and the original brightness value of the Green (G) sub-pixel in the original signal corresponding to each pixel; and the minimum value of the original signal corresponding to each pixel may refer to the minimum value of the original brightness value of the Red (R) sub-pixel, the original brightness value of the Blue (B) sub-pixel and the original brightness value of the Green (G) sub-pixel in the original signal corresponding to each pixel.

In an illustrative embodiment, S1402 may include that: a target signal corresponding to each pixel is determined on the basis of the maximum value and the minimum value of the original signal corresponding to each pixel.

$$W_1 = \min(R_0, G_0, B_0) \qquad \text{Formula (6)}$$

$$\text{gain} = \frac{\max(R_0, G_0, B_0) + W_1}{\max(R_0, G_0, B_0)} \qquad \text{Formula (7)}$$

$$\begin{pmatrix} R_1 \\ G_1 \\ B_1 \end{pmatrix} = \text{gain} \times \begin{pmatrix} R_0 \\ G_0 \\ B_0 \end{pmatrix} - W_1 \qquad \text{Formula (8)}$$

Herein, $R_0$ is the total brightness value of the Red (R) sub-pixel in the original signal, $B_0$ is the total brightness value of the Blue (B) sub-pixel in the original signal, $G_0$ is the total brightness value of the Green (G) sub-pixel in the original signal, $\min(R_0,G_0,B_0)$ is the minimum value of the original signal, $\max(R_0,G_0,B_0)$ is the maximum value of the original signal, $W_1$ is the total brightness value of the White (W) sub-pixel in the target signal, and gain is a gain coefficient, $R_1$ is the total brightness value of the Red (R) sub-pixel in the target signal, $B_1$ is the total brightness value of the Blue (B) sub-pixel in the target signal, and $G_1$ is the total brightness value of the Green (G) sub-pixel in the target signal.

In an illustrative embodiment, taking each pixel in the pixel structure including: one Red (R) sub-pixel, one Blue (B) sub-pixel, one Green (G) sub-pixel, and three White (W) sub-pixels as an example, the $W_1$ may be equally divided to obtain the brightness values respectively corresponding to the three White (W) sub-pixels. At this moment, the brightness values of three White (W) sub-pixels in a pixel are equal. Or, different brightness values can be assigned to the White (W) sub-pixels at different positions considering factors such as pixel lifetime. For example, a large brightness value may be assigned to a White (W) sub-pixel adjacent to a Blue (B) sub-pixel in one pixel. For example, the ratio of the brightness values of the White (W) sub-pixel adjacent to the Red (R) sub-pixel, the White (W) sub-pixel adjacent to the Green (G) sub-pixel, and the White (W) sub-pixel adjacent to the Blue (B) sub-pixel may be 1:1:2, i.e., the brightness value of the White (W) sub-pixel adjacent to the Blue (B) sub-pixel may be 0.5 $W_1$, the brightness value of the White (W) sub-pixel adjacent to the Red (R) sub-pixel may be 0.25 $W_1$, and the White (W) sub-pixel adjacent to the Green (G) sub-pixel may be 0.25 $W_1$. Here, the embodiments of the disclosure do not limit this.

The embodiments of the disclosure further provide a display panel, including the pixel structure as described in one or more of the abovementioned embodiments.

In an illustrative embodiment, the display panel includes, but is not limited to, an OLED display panel, a Micro OLED display panel, a liquid crystal display panel, etc. Herein, the embodiment of the disclosure does not limit this.

Technical details undisclosed in the display panel embodiments of the disclosure may be understood by those skilled in the art with reference to the descriptions about the pixel structure embodiments of the disclosure, which will not be elaborated herein.

The embodiments of the disclosure further provide a display apparatus, including the display panel as described in one or more of the abovementioned embodiments.

In an illustrative embodiment, the display apparatus includes, but is not limited to, an OLED display apparatus or a Micro OLED display apparatus. Here, the embodiments of the disclosure do not limit this.

In an illustrative embodiment, the display apparatus may be: a product or a part with a display function, such as a mobile phone, a tablet computer, a television, a display, a notebook computer, a digital photo frame, or a navigator and the like.

Technical details undisclosed in the display apparatus embodiments of the disclosure may be understood by those skilled in the art with reference to the descriptions about the pixel structure embodiments of the disclosure, which will not be elaborated herein.

Although the implementations disclosed by the disclosure are stated above, the abovementioned content is only the implementations adopted for the convenience of understanding the disclosure and is not intended to limit the disclosure. Any person skilled in the art of the disclosure can make any modification and change in the forms and details of implementation without departing from the spirit and scope of the disclosure. However, the scope of protection of the patent of the disclosure shall still be subject to the scope defined in the attached claims.

The invention claimed is:

1. A pixel structure, comprising:
a plurality of pixel rows and a plurality of pixel columns, wherein each pixel row comprises: sub-pixels of four different colors; the plurality of pixel columns comprise: a plurality of first pixel columns and a plurality of second pixel columns arranged alternately; each first pixel column comprises: sub-pixels of three of the four different colors; each second pixel column comprises: sub-pixels of another color other than the three of the four different colors.

2. The pixel structure according to claim 1, wherein each pixel row is arranged in a straight line shape.

3. The pixel structure according to claim 1, wherein each pixel column is arranged in a bent line shape.

4. The pixel structure according to claim 1, wherein quantities of the sub-pixels of three colors of the first pixel column are equal.

5. The pixel structure according to claim 1, wherein a total quantity of the sub-pixels of the second pixel column is equal to a total quantity of the sub-pixels of the first pixel column.

6. The pixel structure according to claim 1, wherein a ratio of the quantities of the sub-pixels of the four different colors in each pixel row is 1:1:1:3.

7. The pixel structure according to claim 1, wherein colors of adjacent sub-pixels in each pixel row are different.

8. The pixel structure according to claim 1, wherein colors of adjacent sub-pixels in each first pixel column are different.

9. The pixel structure according to claim 1, wherein colors of adjacent sub-pixels in adjacent first pixel columns of the plurality of pixel columns are different.

10. The pixel structure according to claim 1, further comprising: a plurality of data signal lines, wherein each second pixel column is controlled through a data signal line, and each first pixel column is controlled through two data signal lines.

11. The pixel structure according to claim 1, wherein in a case that the pixel structure is in a first display mode, the pixel structure displays by taking a pixel row group formed by two adjacent pixel rows as a unit; or, in a case that the pixel structure is in a second display mode, the pixel structure displays by taking a pixel column group formed by a first pixel column and a second pixel column as a unit.

12. A pixel structure, comprising:
a plurality of pixels arranged in an array, wherein each pixel comprises: sub-pixels of four different colors; and in each pixel, a ratio of quantities of the sub-pixels of four different colors is 1:1:1:3.

13. The pixel structure according to claim 12, wherein each sub-pixel has a shape of a hexagon; and six internal angles of the hexagon are all 120°.

14. The pixel structure according to claim 13, wherein three groups of opposite sides of the hexagon are parallel to each other; and lengths of at least two groups of the opposite sides are equal.

15. The pixel structure according to claim 12, wherein the sub-pixels of three of the four different colors comprises: a red sub-pixel, a blue sub-pixel, and a green sub-pixel, and the sub-pixel of another color other than three of the four different colors is a white sub-pixel.

16. The pixel structure according to claim 15, wherein an area of the blue sub-pixels is greater than an area of the red sub-pixels and an area of the green sub-pixels.

17. The pixel structure according to claim 12, further comprising: a plurality of data signal lines, wherein the sub-pixels of three of the four different colors in each pixel are controlled by two data signal lines; and the sub-pixels of another color other than three of the four different colors in each pixel are controlled by a same data signal line.

18. The pixel structure according to claim 15, further comprising: a plurality of repeating units arranged in an array, wherein each repeating unit comprises: three pixels arranged side by side, and arrangement positions of the sub-pixels of the four different colors in the three pixels are different.

19. The pixel structure according to claim 18, wherein the three pixels comprise: a first pixel, a second pixel, and a third pixel, wherein a first row of the first pixel comprises: a red sub-pixel and a white sub-pixel arranged in sequence; a second row of the first pixel comprises: a blue sub-pixel and a white sub-pixel arranged in sequence; a third row of the first pixel comprises: a green sub-pixel and a white sub-pixel arranged in sequence; a first row of the second pixel comprises: a green sub-pixel and a white sub-pixel arranged in sequence; a second row of the second pixel comprises: a red sub-pixel and a white sub-pixel arranged in sequence; a third row of the second pixel comprises: a blue sub-pixel and a white sub-pixel arranged in sequence; a first row of the third pixel comprises: a blue sub-pixel and a white sub-pixel arranged in sequence; a second row of the third pixel comprises: a green sub-pixel and a white sub-pixel arranged in sequence; and a third row of the third pixel comprises: a red sub-pixel and a white sub-pixel arranged in sequence.

20. A display apparatus, comprising the pixel structure according to claim 1.

* * * * *